US012657357B2

(12) United States Patent (10) Patent No.: US 12,657,357 B2
Guo et al. (45) Date of Patent: Jun. 16, 2026

(54) 6D OBJECT POSE ESTIMATION WITH 2D AND 3D POINTWISE FEATURES

(71) Applicant: Robert Bosch GmbH, Stuttgart (DE)

(72) Inventors: Yuliang Guo, Palo Alto, CA (US);
Xinyu Huang, San Jose, CA (US); Liu Ren, Saratoga, CA (US)

(73) Assignee: Robert Bosch GmbH (DE)

( * ) Notice: Subject to any disclaimer, the term of this patent is extended or adjusted under 35 U.S.C. 154(b) by 1093 days.

(21) Appl. No.: 17/589,431

(22) Filed: Jan. 31, 2022

(65) Prior Publication Data

US 2023/0244835 A1     Aug. 3, 2023

(51) Int. Cl.
| | |
|---|---|
| *G06N 7/01* | (2023.01) |
| *E21B 47/07* | (2012.01) |
| *E21B 47/10* | (2012.01) |
| *G06F 30/27* | (2020.01) |
| *G06T 7/73* | (2017.01) |
| *G06V 10/00* | (2022.01) |
| *G06V 10/70* | (2022.01) |
| *G06V 10/75* | (2022.01) |

(52) U.S. Cl.
CPC ............... *G06F 30/27* (2020.01); *G06T 7/75* (2017.01); *G06V 10/00* (2022.01); *G06V 10/70* (2022.01); *G06V 10/751* (2022.01); *G06T 2207/20081* (2013.01); *G06T 2207/20084* (2013.01)

(58) Field of Classification Search
CPC . G06F 30/27; G06F 30/10; G06T 7/75; G06T 2207/20081; G06T 2207/20084; G06T 7/207; G06N 3/08; G06V 10/26; G06V 10/751; G06V 10/82; G06V 10/00; G06V 10/70
See application file for complete search history.

(56) References Cited

U.S. PATENT DOCUMENTS

| | | | |
|---|---|---|---|
| 10,579,890 B2 * | 3/2020 | Polidor | H04N 23/67 |
| 2022/0405506 A1 * | 12/2022 | Taamazyan | B25J 15/0608 |

OTHER PUBLICATIONS

Dynamic Graph Convolution Neural Network (Year: 2019).*
Marr Revisited (Year: 2016).*
Range Aware Attention Network for Lidar (Year: 2021).*
Weng et al. GNN3DMOT: GraphNeural Network for 3D Multi-Object Tracking with Multi-Feature Learning. arXiv:2006.07327v1. Jun. 2020. (Year: 2020).*

(Continued)

*Primary Examiner* — Emerson C Puente
*Assistant Examiner* — Amir Elsayed Darwish
(74) *Attorney, Agent, or Firm* — Dickinson Wright PLLC

(57) ABSTRACT

Methods and systems for determining a 6D pose of an object in an image are disclosed. In embodiments, an input image is received from a sensor, wherein the input image includes an object in the image. A trained image encoder transforms the input image into a normal map and an instance segmentation map. The normal map is encoded with pointwise 2D features. A 3D CAD model is selected from memory that resembles the object in the image. The 3D CAD model is encoded with pointwise 3D features. The pointwise 2D features are matched with the pointwise 3D features to obtain correspondences between the 2D features and the 3D features. The 6D pose of the object is then determined based on the correspondences.

18 Claims, 10 Drawing Sheets

400
402 — Receive Input Image From Sensor
404 — Produce Normal Map And Instance Segmentation Map From Input Image
406 — Encode Normal Map With Pointwise 2D Features
408 — Select 3D CAD Model That Resembles Object In Input Image
410 — Encode 3D CAD Model With Pointwise 3D Features
412 — Match Pointwise 2D Features With Pointwise 3D Features To Obtain Correspondences
414 — Determine 6D Pose Based On Correspondences

(56)                 References Cited

OTHER PUBLICATIONS

Xiang et al. PoseCNN: A Convolutional Neural Network for 6 Object Pose Estimation in Cluttered Scenes. arXiv:1711.00199v3. May 2018. (Year: 2018).*
Zeng et al. Learning Skeletal Graph Neural Networks for Hard 3D Pose Estimation. arXiv:2108.07181v2. Aug. 2021. (Year: 2021).*
Liu et al., "Learning 2d-3d correspondences to solve the blind perspective-n-point problem", arXiv 2020, 23 pages.
Li et al., "CDPN: Coordinates-based disentangled pose network for real-time rgb-based 6-dof object pose estimation." ICCV 2019, 10 pages.
Peng et al., "PVnet: Pixel-wise voting network for 6DoF pose estimation." CVPR 2019, 10 pages.
Labbe et al., "Cosypose: Consistent multi-view multi-object 6d pose estimation." ECCV 2020, 41 pages.
Li et al., "Deepim: Deep iterative matching for 6d pose estimation." ECCV. 2018, 23 pages.

* cited by examiner

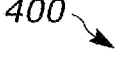

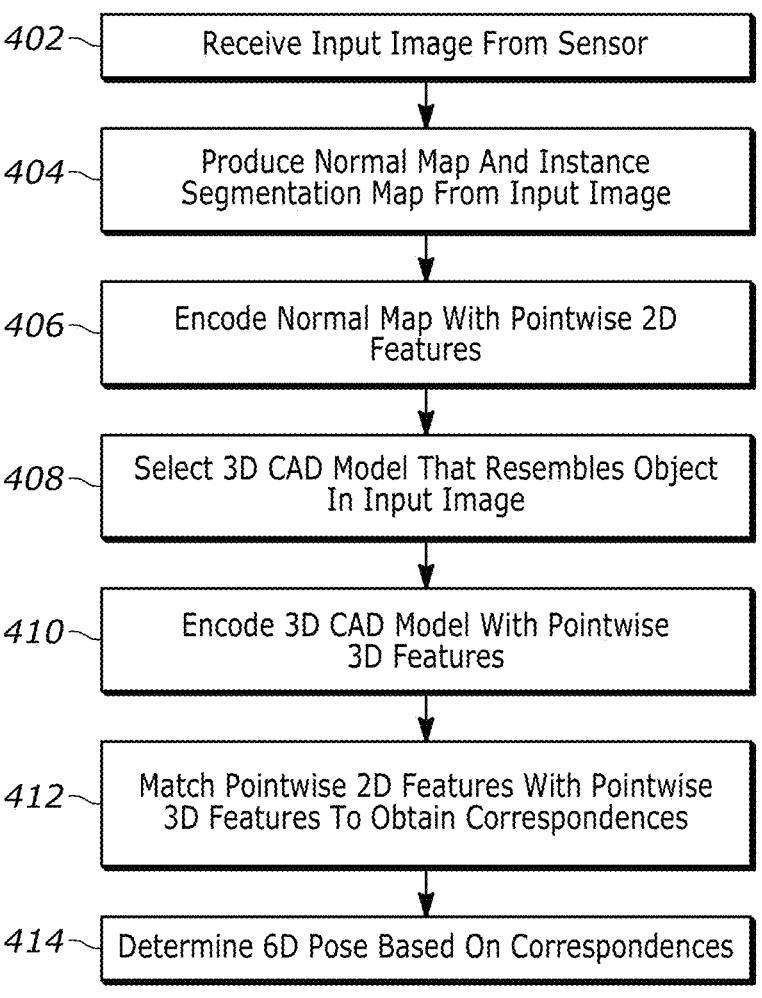

402 — Receive Input Image From Sensor

404 — Produce Normal Map And Instance Segmentation Map From Input Image

406 — Encode Normal Map With Pointwise 2D Features

408 — Select 3D CAD Model That Resembles Object In Input Image

410 — Encode 3D CAD Model With Pointwise 3D Features

412 — Match Pointwise 2D Features With Pointwise 3D Features To Obtain Correspondences 414 — Determine 6D Pose Based On Correspondences

6D OBJECT POSE ESTIMATION WITH 2D AND 3D POINTWISE FEATURES

TECHNICAL FIELD

The present disclosure relates to methods and systems for estimating a 6D pose (location and orientation) of an object. In embodiments described herein, the 6D pose of the object is estimated using pointwise features of both a two-dimensional and three-dimensional derivational image of the object.

BACKGROUND 6D pose estimation is the task of detecting the 6D pose of an object, which includes its location and orientation. The awareness of the position and orientation of objects in an image or scene is sometimes referred to as 6D, where the "D" stands for degrees of freedom pose. This can also be referred to as 6DoF (degree of freedom) estimation.

6D pose estimation plays a key role in a variety of applications, including robotic navigation, manipulation, and augmented-reality (AR) assisted machine assembly, to name a few. In the example of robotic navigation, the ability for the robot to understand the location and orientation of an object allows the robot to more accurately recognize and grasp an object, for example. Autonomous vehicles use 6D pose estimation to recognize roads and obstacles. In AR applications, 6D pose estimation is used to measure the pose of objects in the real environment and add virtual objects onto them in a correct pose.

SUMMARY

In one embodiment, a computer-implemented method for determining a 6D pose of an object in an image is provided. An input image is received from a sensor, wherein the input image includes an object in the image. A trained image encoder transforms the input image into a normal map and an instance segmentation map. The normal map is encoded with pointwise 2D features. A 3D CAD model is selected from memory that resembles the object in the image. The 3D CAD model is encoded with pointwise 3D features. The pointwise 2D features are matched with the pointwise 3D features to obtain correspondences between the 2D features and the 3D features. The 6D pose of the object is then determined based on the correspondences In another embodiment, a system for determining a 6D pose of an object in an image utilizing image processing is provided. The system includes an input interface configured to receive an image from a sensor. The system includes a processor in communication with the input interface. The processor is programmed to utilize an image encoder to convert the input into a normal map and an instance segmentation map, encode the normal map with pointwise 2D features, select a three-dimensional CAD model from memory associated with an object in the input image, encode the three-dimensional CAD model with pointwise 3D features, match the pointwise 3D features with the pointwise 3D features to obtain correspondences therebetween, and determine a 6D pose of the object based on the correspondences.

In another embodiment, a computer-implemented method for determining a 6D pose of an object in an image is provided. The computer-implemented method includes receiving an input image from a sensor, wherein the input image includes an object in the image; producing a normal map corresponding to the image; producing an instance segmentation map corresponding to the image; determining local pointwise features of the object in the normal map; selecting a three-dimensional CAD model from memory that resembles the object in the image; determining local pointwise features of the three-dimensional CAD model; and matching the local pointwise features of the object in the normal map with the local pointwise features of the three-dimensional CAD model to find correspondences.

BRIEF DESCRIPTION OF THE DRAWINGS

FIG. 4 illustrates a flowchart of a method of determining a 6D pose of an object, according to one embodiment utilizing the teachings disclosed herein.

DETAILED DESCRIPTION

Figure 1:
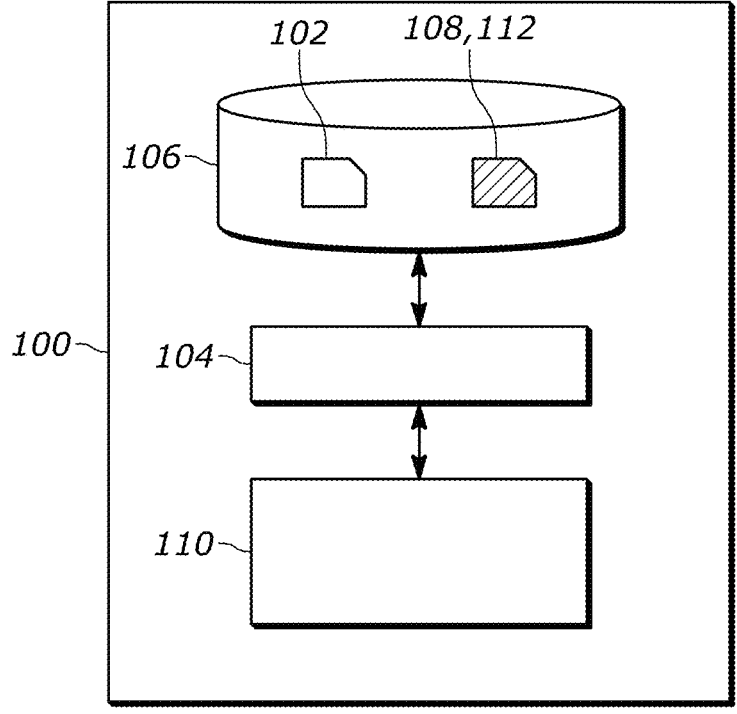
FIG. 1 shows a system for training a neural network, according to an embodiment.

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the embodiments. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

6D pose can refer to a location (position) and orientation of an object. It can refer to the posture of an object, specifically on the basis of a translation vector and a rotation vector. 6D pose estimation is a common and important task in a variety of applications, including industry. Obtaining the 6D pose of an object is the basis for many other functions such as bin picking, autonomous driving, augmented reality, autopilot, etc. The methods of 6D pose estimation have been enriched and improved over the years. These methods include direct regression with refinement, key point detection with Perspective-n-Point (PnP), and dense coordinate regression with PnP. These methods have advantages and limitations, however none of them have a focus on solving the domain gap between synthetic data and real data from the architecture design. Additionally, although dense coordinate regression shows some advantage in handling occlusion and textureless cases compared to the other two methods mentioned, it can be very sensitive to the variance in object scale and the noise within segmentation inputs.

According to various embodiments such as those disclosed herein, systems and methods for estimating a 6D pose of an object are provided to handle the domain gap, scale variance, and noisy segmentation. An input form a sensor (e.g., an image or video from a camera) is received and processed through an image encoder. The input image is encoded to produce a normal map and a generic instance segmentation map. The normal map is then processed with a two-dimensional graphical neural network (GNN 2D) to determine pointwise 2D features of an object in the map. These pointwise 2D features are compared to pointwise 3D features of a corresponding three-dimensional representation of the object. To derive the pointwise 3D features, first the normal map and generic instance segmentation map are input into a machine-learning model (e.g., deep neural network, DNN). This machine-learning model produces a 3D computer-aided design (CAD) of the object in the image. Then, a three-dimensinoal graphical neural network (GNN 3D) processes the 3D CAD of the object to determine the pointwise 3D features of the CAD object. These pointwise 3D features can be compared to the pointwise 2D features in a 2D-3D matching model or algorithm to produce correspondences between the two. This allows the 6D pose to be determined according to the teachings disclosed herein.

The disclosed systems and methods rely on machine-learning models, such as graphical neural networks, deep neural networks, and the like. FIG. 1 shows a system 100 for training a neural network, e.g., a deep neural network. The neural network or deep neural networks shown and described are merely examples of the types of machine-learning networks or neural networks that can be used, such as the graphical neural networks and deep neural networks and the like that are shown and described further below. The system 100 may comprise an input interface for accessing training data 102 for the neural network. For example, as illustrated in FIG. 1, the input interface may be constituted by a data storage interface 104 which may access the training data 102 from a data storage 106. For example, the data storage interface 104 may be a memory interface or a persistent storage interface, e.g., a hard disk or an SSD interface, but also a personal, local or wide area network interface such as a Bluetooth, Zigbee or Wi-Fi interface or an ethernet or fiberoptic interface. The data storage 106 may be an internal data storage of the system 100, such as a hard drive or SSD, but also an external data storage, e.g., a network-accessible data storage.

In some embodiments, the data storage 106 may further comprise a data representation 108 of an untrained version of the neural network which may be accessed by the system 100 from the data storage 106. It will be appreciated, however, that the training data 102 and the data representation 108 of the untrained neural network may also each be accessed from a different data storage, e.g., via a different subsystem of the data storage interface 104. Each subsystem may be of a type as is described above for the data storage interface 104. In other embodiments, the data representation 108 of the untrained neural network may be internally generated by the system 100 on the basis of design parameters for the neural network, and therefore may not explicitly be stored on the data storage 106. The system 100 may further comprise a processor subsystem 110 which may be configured to, during operation of the system 100, provide an iterative function as a substitute for a stack of layers of the neural network to be trained. Here, respective layers of the stack of layers being substituted may have mutually shared weights and may receive as input an output of a previous layer, or for a first layer of the stack of layers, an initial activation, and a part of the input of the stack of layers. The processor subsystem 110 may be further configured to iteratively train the neural network using the training data 102. Here, an iteration of the training by the processor subsystem 110 may comprise a forward propagation part and a backward propagation part. The processor subsystem 110 may be configured to perform the forward propagation part by, amongst other operations defining the forward propagation part which may be performed, determining an equilibrium point of the iterative function at which the iterative function converges to a fixed point, wherein determining the equilibrium point comprises using a numerical root-finding algorithm to find a root solution for the iterative function minus its input, and by providing the equilibrium point as a substitute for an output of the stack of layers in the neural network. The system 100 may further comprise an output interface for outputting a data representation 112 of the trained neural network, this data may also be referred to as trained model data 112. For example, as also illustrated in FIG. 1, the output interface may be constituted by the data storage interface 104, with said interface being in these embodiments an input/output ('IO') interface, via which the trained model data 112 may be stored in the data storage 106. For example, the data representation 108 defining the 'untrained' neural network may during or after the training be replaced, at least in part by the data representation 112 of the trained neural network, in that the parameters of the neural network, such as weights, hyperparameters and other types of parameters of neural networks, may be adapted to reflect the training on the training data 102. This is also illustrated in FIG. 1 by the reference numerals 108, 112 referring to the same data record on the data storage 106. In other embodiments, the data representation 112 may be stored separately from the data representation 108 defining the 'untrained' neural network. In some embodiments, the output interface may be separate from the data storage interface 104, but may in general be of a type as described above for the data storage interface 104.

The structure of the system 100 is one example of a system that may be utilized to train the graphical neural networks and deep neural networks described herein. Additional structure for operating and training the machine-learning models is shown in FIG. 2.

Figure 2:
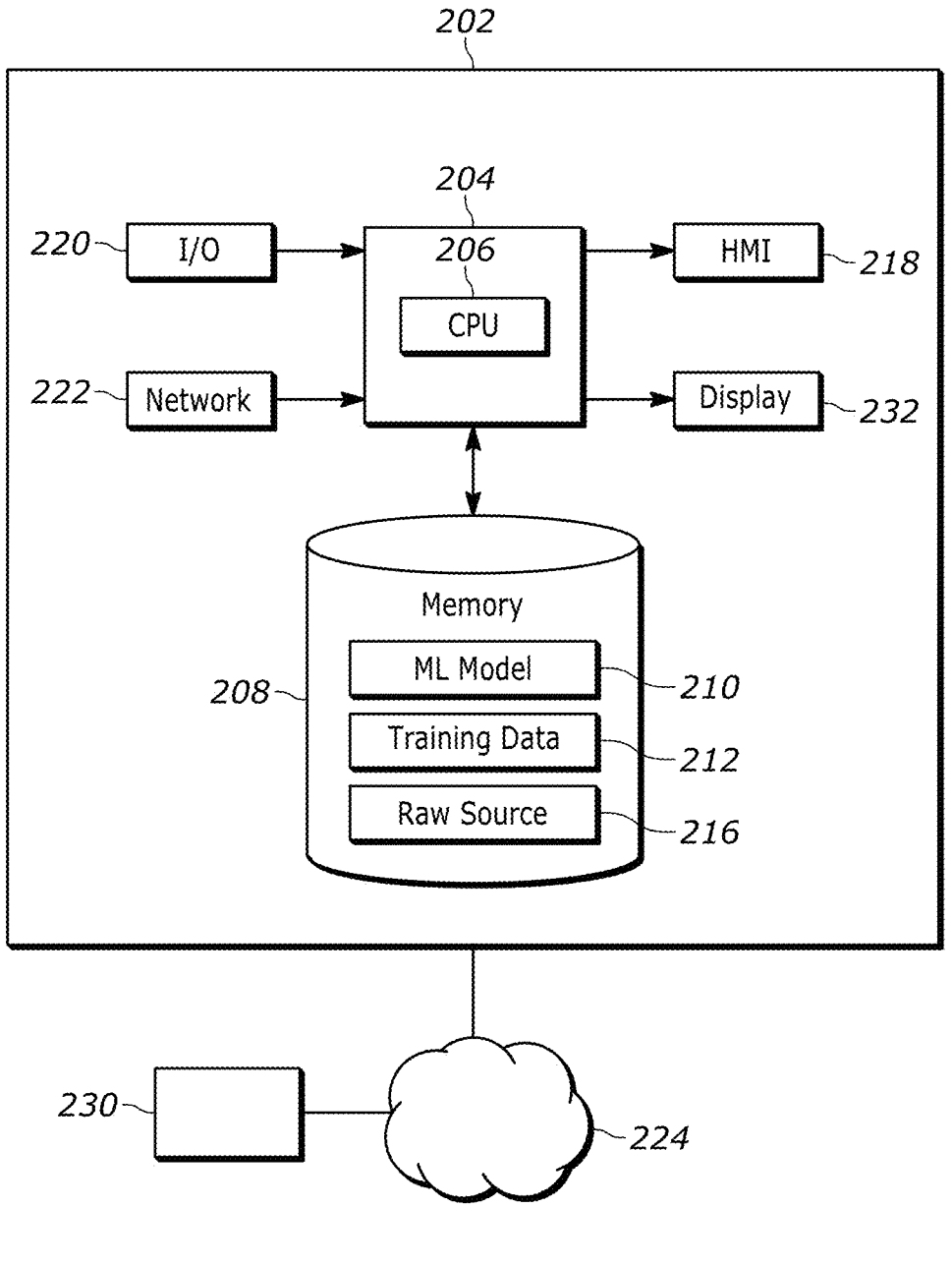
FIG. 2 shows a computer-implemented method for training and utilizing a neural network, according to an embodiment.

FIG. 2 depicts a system 200 to implement the machine-learning models described herein, for example the graphical neural networks and deep neural networks described herein. Other types of machine-learning models can be used, and the GNNs and DNNs described herein are not the only types of machine-learning models capable of being used in the object pose estimation system of this disclosure. For example, if the input image contains an ordered sequence of pixels, a convolutional neural network (CNN) may be utilized. The system 200 can be implemented to perform one or more of the phases of the object pose estimation described herein. The system 200 may include at least one computing system 202. The computing system 202 may include at least one processor 204 that is operatively connected to a memory unit 208. The processor 204 may include one or more integrated circuits that implement the functionality of a central processing unit (CPU) 206. The CPU 206 may be a commercially available processing unit that implements an instruction set such as one of the x86, ARM, Power, or MIPS instruction set families. During operation, the CPU 206 may execute stored program instructions that are retrieved from the memory unit 208. The stored program instructions may include software that controls operation of the CPU 206 to perform the operation described herein. In some examples, the processor 204 may be a system on a chip (SoC) that integrates functionality of the CPU 206, the memory unit 208, a network interface, and input/output interfaces into a single integrated device. The computing system 202 may implement an operating system for managing various aspects of the operation. While one processor 204, one CPU 206, and one memory 208 is shown in FIG. 2, of course more than one of each can be utilized in an overall system.

The memory unit 208 may include volatile memory and non-volatile memory for storing instructions and data. The non-volatile memory may include solid-state memories, such as NAND flash memory, magnetic and optical storage media, or any other suitable data storage device that retains data when the computing system 202 is deactivated or loses electrical power. The volatile memory may include static and dynamic random-access memory (RAM) that stores program instructions and data. For example, the memory unit 208 may store a machine-learning model 210 or algorithm, a training dataset 212 for the machine-learning model 210, raw source dataset 216.

The computing system 202 may include a network interface device 222 that is configured to provide communication with external systems and devices. For example, the network interface device 222 may include a wired and/or wireless Ethernet interface as defined by Institute of Electrical and Electronics Engineers (IEEE) 802.11 family of standards. The network interface device 222 may include a cellular communication interface for communicating with a cellular network (e.g., 3G, 4G, 5G). The network interface device 222 may be further configured to provide a communication interface to an external network 224 or cloud.

The external network 224 may be referred to as the world-wide web or the Internet. The external network 224 may establish a standard communication protocol between computing devices. The external network 224 may allow information and data to be easily exchanged between computing devices and networks. One or more servers 230 may be in communication with the external network 224.

The computing system 202 may include an input/output (I/O) interface 220 that may be configured to provide digital and/or analog inputs and outputs. The I/O interface 220 is used to transfer information between internal storage and external input and/or output devices (e.g., HMI devices). The I/O 220 interface can includes associated circuity or BUS networks to transfer information to or between the processor(s) and storage. For example, the I/O interface 220 can include digital I/O logic lines which can be read or set by the processor(s), handshake lines to supervise data transfer via the I/O lines; timing and counting facilities, and other structure known to provide such functions. Examples of input devices include a keyboard, mouse, sensors, etc. Examples of output devices include monitors, printers, speakers, etc. The I/O interface 220 may include additional serial interfaces for communicating with external devices (e.g., Universal Serial Bus (USB) interface). The I/O interface 220 can be referred to as an input interface (in that it transfers data from an external input, such as a sensor), or an output interface (in that it transfers data to an external output, such as a display).

The computing system 202 may include a human-machine interface (HMI) device 218 that may include any device that enables the system 200 to receive control input. Examples of input devices may include human interface inputs such as keyboards, mice, touchscreens, voice input devices, and other similar devices. The computing system 202 may include a display device 232. The computing system 202 may include hardware and software for outputting graphics and text information to the display device 232. The display device 232 may include an electronic display screen, projector, printer or other suitable device for displaying information to a user or operator. The computing system 202 may be further configured to allow interaction with remote HMI and remote display devices via the network interface device 222.

The system 200 may be implemented using one or multiple computing systems. While the example depicts a single computing system 202 that implements all of the described features, it is intended that various features and functions may be separated and implemented by multiple computing units in communication with one another. The particular system architecture selected may depend on a variety of factors.

The system 200 may implement a machine-learning algorithm 210 that is configured to analyze the raw source dataset 216. The raw source dataset 216 may include raw or unprocessed sensor data that may be representative of an input dataset for a machine-learning system. The raw source dataset 216 may include video, video segments, images, text-based information, audio or human speech, time series data (e.g., a pressure sensor signal over time), and raw or partially processed sensor data (e.g., radar map of objects). Several different examples of inputs are shown and described with reference to FIGS. 6-12. In some examples, the machine-learning algorithm 210 may be a neural network algorithm (e.g., deep neural network) that is designed to perform a predetermined function. For example, the neural network algorithm may be configured in automotive applications to identify obstacles or pedestrians in images, as well as their respective 6D poses.

The computer system 200 may store a training dataset 212 for the machine-learning algorithm 210. The training dataset 212 may represent a set of previously constructed data for training the machine-learning algorithm 210. The training dataset 212 may be used by the machine-learning algorithm 210 to learn weighting factors associated with a neural network algorithm. The training dataset 212 may include a set of source data that has corresponding outcomes or results that the machine-learning algorithm 210 tries to duplicate via the learning process. In this example, the training dataset 212 may include input images that include an object (e.g., a pedestrian). The input images may include various scenarios in which the objects are identified.

The machine-learning algorithm 210 may be operated in a learning mode using the training dataset 212 as input. The machine-learning algorithm 210 may be executed over a number of iterations using the data from the training dataset 212. With each iteration, the machine-learning algorithm 210 may update internal weighting factors based on the achieved results. For example, the machine-learning algorithm 210 can compare output results (e.g., a reconstructed or supplemented image, in the case where image data is the input) with those included in the training dataset 212. Since the training dataset 212 includes the expected results, the machine-learning algorithm 210 can determine when performance is acceptable. After the machine-learning algorithm 210 achieves a predetermined performance level (e.g., 100% agreement with the outcomes associated with the training dataset 212), or convergence, the machine-learning algorithm 210 may be executed using data that is not in the training dataset 212. It should be understood that in this disclosure, "convergence" can mean a set (e.g., predetermined) number of iterations have occurred, or that the residual is sufficiently small (e.g., the change in the approximate probability over iterations is changing by less than a threshold), or other convergence conditions. The trained machine-learning algorithm 210 may be applied to new datasets to generate annotated data.

The machine-learning algorithm 210 may be configured to identify a particular feature in the raw source data 216. The raw source data 216 may include a plurality of instances or input dataset for which supplementation results are desired. For example, the machine-learning algorithm 210 may be configured to identify the presence of a pedestrian in video images and annotate the occurrences. The machine-learning algorithm 210 may be programmed to process the raw source data 216 to identify the presence of the particular features. The machine-learning algorithm 210 may be configured to identify a feature in the raw source data 216 as a predetermined feature (e.g., obstacle, pedestrian, road sign, etc.). The raw source data 216 may be derived from a variety of sources. For example, the raw source data 216 may be actual input data collected by a machine-learning system. The raw source data 216 may be machine generated for testing the system. As an example, the raw source data 216 may include raw video images from a camera.

In an example, the raw source data 216 may include image data representing an image. Applying the machine-learning algorithms (e.g., GNN 2D, GNN 3D, and DNN) described herein, the output can be pointwise features for dense correspondence or matching.

Figure 3:
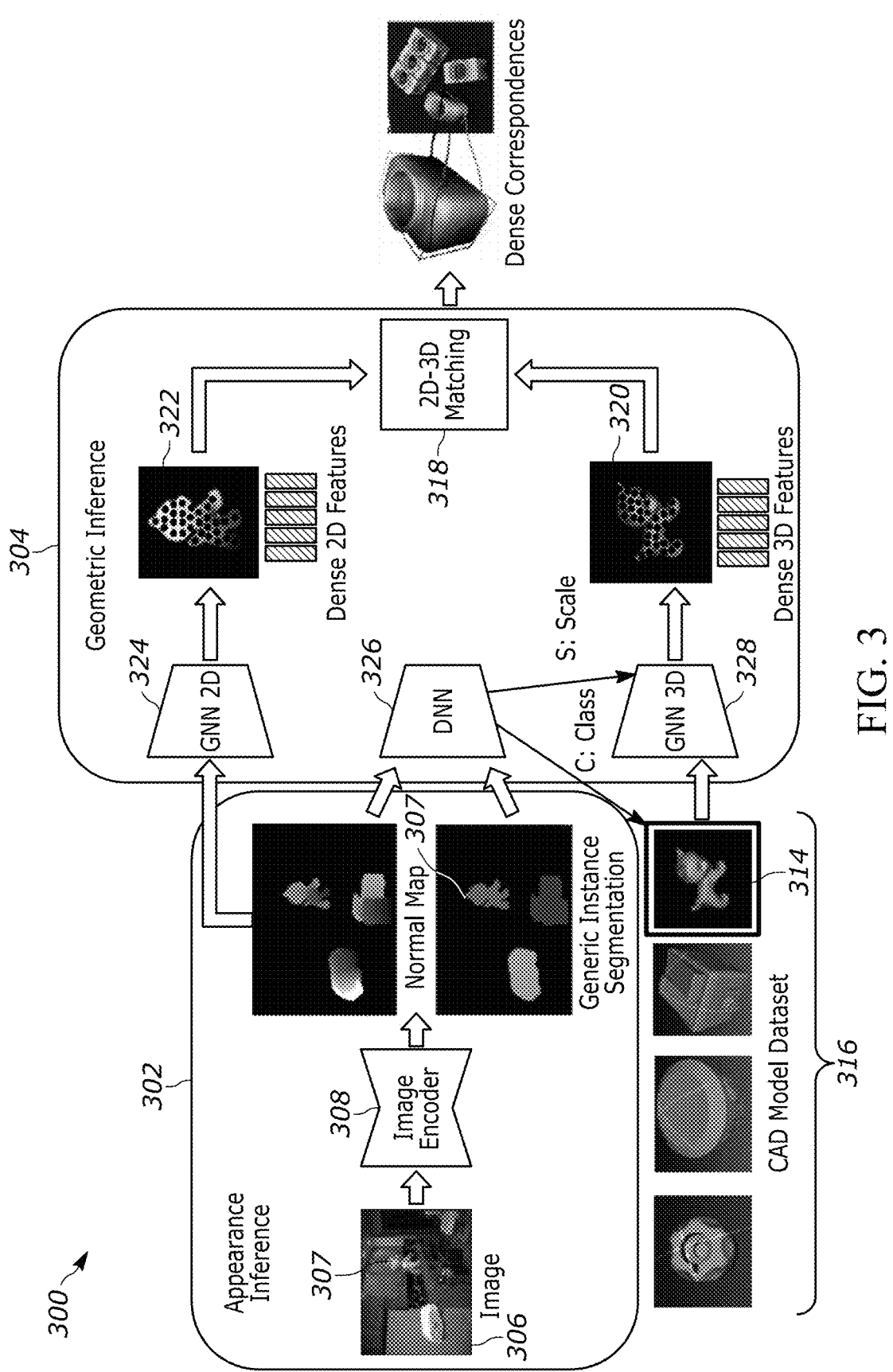
FIG. 3 show a system flowchart for estimating a 6D pose of an object in an image, according to one embodiment utilizing the teachings disclosed herein.

Given the above description of the machine-learning models, along with the structural examples of FIGS. 1-2 configured to carry out the models, FIG. 3 illustrates a flow chart of a system 300 for estimating a 6D pose of an object, according to an embodiment. The system includes an appearance inference 302 and a geometric inference 304 in two isolated stages. In the appearance inference 302 stage, an image 306 (containing an object 307 therein) is converted by an image encoder 308 into a normal map 310 and a generic instance segmentation map 312, as will be described further below. In the geometric inference 304 stage, the object's class is determined directly from the shape cues, such that a corresponding CAD model 314 from a CAD model dataset 316 is used for 2D-3D matching. The matching (e.g., dense matching) at 318 is based on pointwise 3D features 320 encoded from the CAD model 314 and pointwise 2D features 322 encoded from the normal map 310. The dense matching at 318 is applied to find the optimal correspondences between 2D and 3D points which can then go through PnP and RANSAC (for example) to recover the object's 6D pose.

The image 306 is one example of an input into the system 300. In other embodiments, the input is other types of inputs described above, such as video, video segments, text-based information, audio or human speech, time series data (e.g., a pressure sensor signal over time), and raw or partially processed sensor data (e.g., radar map of objects). In the illustrated embodiment, the input is an image 306 containing an object 307 in the image. In this simplified embodiment for illustration purposes, the subject object 307 is a cat; in other usages such as autonomous vehicles, the object may be a pedestrian; in other usages such as robotic automation, the object may be a component to be grasped by the robot.

The image encoder 308 converts the input image 306 into two different maps, namely a normal map 310 and an instance segmentation map 312. While only one image encoder 308 is shown, it should be understood that more than one encoder can be used, such as a designated image encoder to convert the input image 306 into the normal map 310, and another designated image encoder to convert the input image 306 into the instance segmentation map 312. Regarding converting the input image 306 into the normal map 310, the encoder 308 can create a normal RGB images from the input image, where the RGB components correspond to the X, Y, and Z coordinates, respectively, of the surface of the objects in the image. For example, the darker a pixel in the normal map, the further it is away from the point of reference (e.g., camera). This creates an illusion of depth in a two-dimensional normal map, wherein the different colors allow subsequent processing to determine pointwise depth information of each pixel of the map. Each object within the image, such as object 307 amongst others, can be converted to appear in the normal map.

Regarding the instance segmentation map 312, instance segmentation gives different labels (e.g., colors) for separate instances of objects that might belong to the same class. In other words, the image encoder 308 treats multiple objects of the same class as distinct individual instances, and provides them with different labels accordingly. This is different than semantic segmentation, for example, which associates every pixel of an image with a class label (e.g., person, sign, vehicle, etc) and treats multiple objects of the same class as a single entity with the same label. Compared to semantic segmentation, instance segmentation allows downstream image processing to better focus on individual objects even if the objects are of the same class. In the example shown in FIG. 3, the instance segmentation map shows three objects (including object 307), each object shaded with a single color different than the other colors.

To produce the pointwise 2D features at 322, the normal map is processed through a two-dimensional graphical neural network (GNN 2D) 324. Any other suitable machine-learning model may be utilized at 324, but in this embodiment, the GNN 2D is configured to determine geometric information on a pointwise basis, i.e., depth information from the normal map on a per-pixel or per-point basis. The GNN 2D 324 is configured to perform inference on data described by graphs, wherein each point of the object in the normal map is represented as part of a graph. The machine-learning model (e.g., GNN 2D 324) can be trained to do so according to the teachings provided herein. The end result of the GNN 2D 324 is dense 2D features that can be used in a downstream 2D-3D matching at 318.

In an embodiment, the GNN 2D 324 is configured to take an unordered set of points as an input, and recode each point with its pixel position (x, y) and the normal orientation (dx, dy, dz). A multilayer perception (MLP) layer can be applied first to transfer each five-dimensional vector into a higher dimensional vector, e.g., 128-dimensional vector. The set of high-dimensional vectors go through a transformer encoder which outputs a set of vectors with the same dimensions. The GNN 3D model described below can have the same architecture as the GNN 2D model, with a difference being that the input points records x, y, z, dz, dy, dz which are 6D vectors.

Also within the geometric inference 304, both the normal map 310 and the instance segmentation map 312 are input into another machine-learning model, such as a deep neural network (DNN) 326. The DNN 326 includes an input layer, an output layer, and multiple intermediate layers between the input layer and the output layer. The DNN 326 includes neurons, synapses, weights, biases, and functions, for example. The DNN 326 is trained to determine a class of a certain object (in this case, object 307) based on either or both of the normal map 310 and instance segmentation map 312. The DNN 326 then locates and retrieves a 3D CAD model 314 from a database 316 of 3D CAD models that represents the determined class of the object 307. In the illustrated embodiment, the object 307 is determined by the DNN 326 to be a cat, and thus retrieves a stored 3D CAD model of a cat. In other embodiments, the object is a pedestrian, and the DNN 326 retrieves a stored 3D CAD model of a pedestrian. There may multiple stored 3D CAD models belonging to the determined class; the DNN 326 can be trained to identify which one of the stored 3D CAD models of the determined class most resembles the object 317. In other embodiments, there is only one 3D CAD model for a given class, and that 3D CAD model is chosen as the selected 3D CAD model 314.

The selected 3D CAD model 314 is then input into another machine-learning model, namely a three-dimensional graphical neural network (GNN 3D) 328, according to an embodiment. The GNN 3D 328 is trained to produce pointwise geometric information about the 3D CAD model 314. Any other suitable machine-learning model may be utilized at 328, but in this embodiment, the GNN 3D is configured to determine geometric information on a pointwise basis, i.e., depth information from the CAD model on a per-pixel or per-point basis. As 3D CAD models are updated in the database, so too can the outputs of the GNN 3D 328. The GNN 3D 328 is configured to perform inference on data described by graphs, wherein each point of the object in the 3D CAD model is represented as part of a graph. The machine-learning model (e.g., GNN 3D 328) can be trained to do so according to the teachings provided herein. The end result of the GNN 3D 328 is dense 3D features that can be used in a downstream 2D-3D matching at 318.

One benefit of this system 300 is that the geometric inference 304 is not affected by the domain gap and can be purely trained from synthetic data. In the appearance inference 302, the two intermediate representations in the normal map 310 and instance segmentation map 312 are by-nature domain-invariant and include sufficient information to facilitate the later geometric inferencing at 304. And, the appearance inferences regresses generic instance segmentation rather than semantic segmentation because the appearance cues can be critical to separate objects from each other (and from the background) but are not supposed to be domain-consistent in reasoning the object's class. Given this system structure, the geometric inference can rely only on the geometric cues so that it is not affected by the domain gap and can be purely trained from synthetic data. This improves the robustness of the 2D-3D matching under scale variation of the observed objects in 2D images.

With the normal map 307 encoded into pointwise features, and the 3D CAD model 314 encoded into pointwise features, 2D-3D matching at 318 determines the optimal correspondences between these 2D and 3D points. The 2D-3D matching 318 can be performed according to available 2D-3D matching architectures, such as PnP or others. The optimal correspondences between the 3D and 3D points can then go through PnP and/or random sample consensus (RANSAC) to determine the 6D pose of the object 307 in the image. RANSAC can be a non-deterministic iterative algorithm that estimates the parameter of the 2D-3D matching from a dataset that contains outliers.

FIG. 4 illustrates a flowchart of a method 400 of determining a 6D pose of an object, according to one embodiment utilizing the teachings disclosed herein. The method 400 may be performed using the structure disclosed herein, such as one or more processors configured to carry out instructions stored in memory. At 402, the processor(s) receives an input image from a sensor. Again, the sensor may be, for example, a camera. The input image may include an object, among other objects. At 404, the processor(s) produce a normal map 310 and an instance segmentation map 312. This can be done via an image encoder 308 for example. At 406, the normal map 310 is encoded with pointwise 2D features. This can be performed using a GNN 2D 324 or other similar machine-learning model. One example of the result of this is shown at 322, with pointwise geometric features of the object in the normal map shown.

At 408, the processor(s) selects a 3D CAD model (shown at 314) that resembles the object. This can be performed using DNN 326, which receives the normal map and the instance segmentation map as input. The DNN 326 can determine a class of the object, for example, and retrieve one or more corresponding CAD models stored in a model dataset 316 that belongs to that class, selecting the one CAD model from that class that most resembles the object based on DNN analysis.

At 410, the processor(s) encodes the 3D CAD model with pointwise 2D features. This can be performed utilizing GNN 3D 328, or other similar machine-learning model. One example of the result of this is shown at 320, with pointwise geometric features of the 3D CAD model shown.

At 412, the processor(s) matches the pointwise 2D features with the pointwise 3D features to obtain correspondences amongst the features. This can be performed using 2D-3D matching algorithms 318 or machine-learning models. At 414, the processor(s) determine the 6D pose of the object based on the correspondences.

Figure 5:
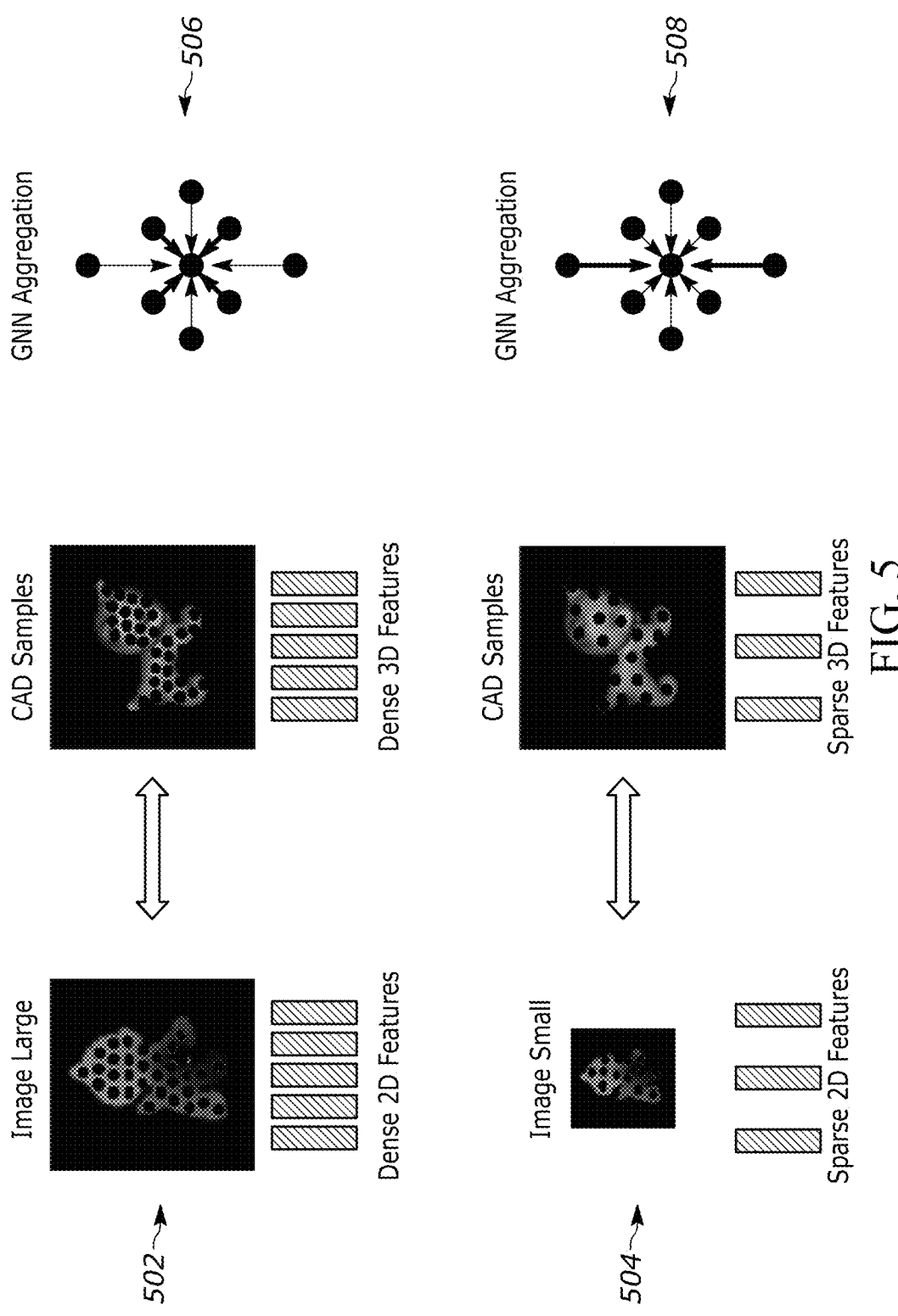
FIG. 5 illustrates a schematic of a scale-aware 3D shape encoder for 2D-3D matching, according to an embodiment.

As mentioned above with reference to FIG. 3, 2D-3D matching or dense matching can be applied at 318 to find the optimal correspondences between 2D and 3D points, which can then go through PnP and/or RANSAC to recover the 6D pose of the object. The system 300 can be configured to scale-aware; when the various observed 2D object pointwise data appears at difference scales, the pointwise 2D points are expected to be matched to 3D model points with different granularity. Reference is made to FIG. 5 which shows a schematic example of the scale-aware aspect of the systems disclosed herein. In general, as the scale of the 2D feature mask (e.g., pointwise 2D features at 322) increases, so too does the scale of the corresponding 3D feature mask (e.g., pointwise 3D features at 320).

To avoid resampling and manual exclusion of samples which may lose essential information, the 3D GNN 328 is configured to automatically sort to the optimal granularity to encode the 3D features. To do so, the DNN 326 is configured to estimate a scale variable (S) and use it as an input variable of the GNN 3D 328. Given the scale input, the GNN 3D 328 can adapt the weights in feature aggregation such that the objects observed far from the camera put higher weights on those graph links with larger distance, and vice versa, as illustrated in FIG. 5.

In general, when an object in the image 306 is very large, it has dense 2D features, represented at 502. And, when the object in the image 306 is smaller, it has less dense (more sparse) 2D features, represented at 504. As the 2D features are denser, the aggregation within the GNN 3D places more weights on the closer neighboring nodes, shown schematically at 506. Conversely, as the 2D features become sparser, more weight is placed on the further neighboring nodes, shown schematically at 508. Each center point of the aggregation at 506, 508 is an aggregation of features from its neighborhood. Accordingly, as the scale of 2D features of the object changes as determined by the DNN 326, the resulting scale of the 3D features produced by the GNN 3D 328 changes. These teachings may be applied to different objects within the same image. For example, a first object within the image may be located at a first distance from the camera and thus has a sparse 2D feature distribution as shown at 504, and a second object within the same image may be located at a second distance (e.g., closer than the first distance) from the camera and thus has a denser 2D feature distribution as shown at 502.

Figure 6:
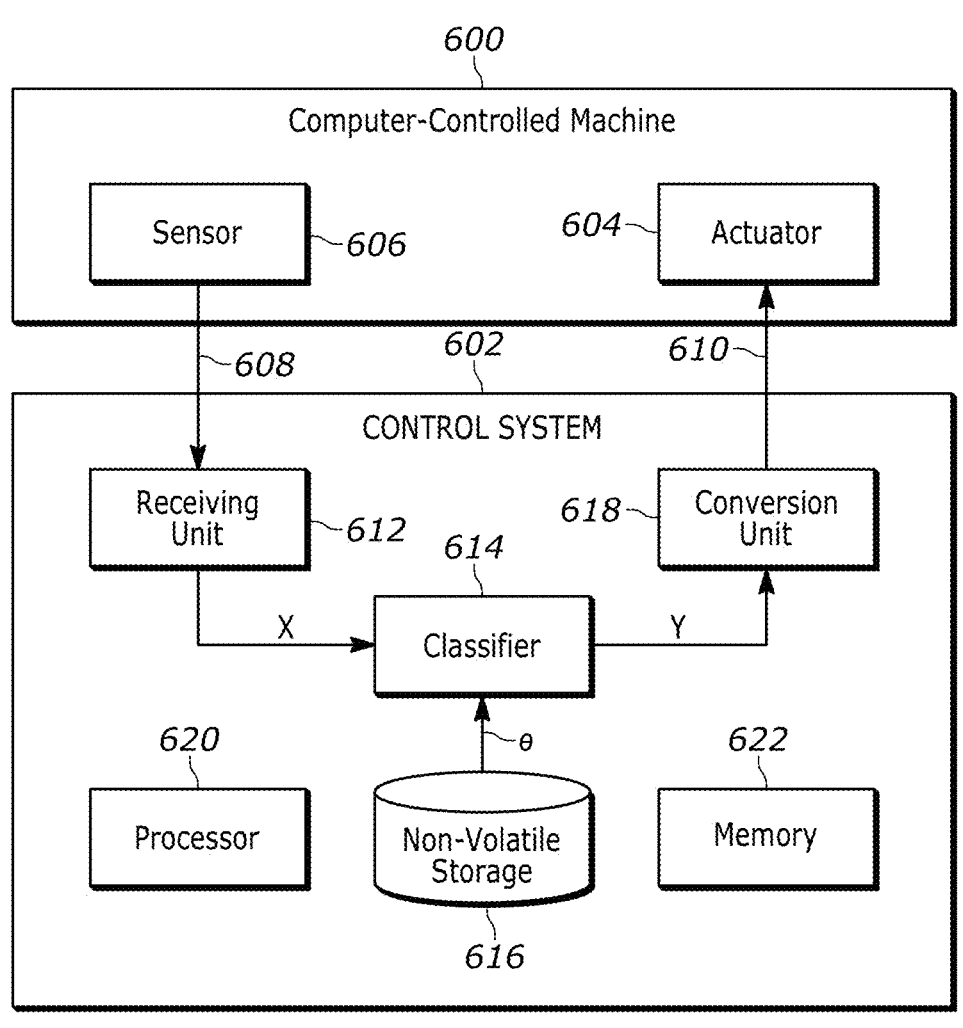
FIG. 6 depicts a schematic diagram of an interaction between a computer-controlled machine and a control system, according to an embodiment.

The machine-learning models described herein can be used in many different applications, and not just in the context of pedestrian or road sign detection for a vehicle. Additional applications where 6D pose estimation may be used are shown in FIGS. 7-12. Structure used for training and using the machine-learning models for these applications (and other applications) are exemplified in FIG. 6. FIG. 6 depicts a schematic diagram of an interaction between a computer-controlled machine 600 and a control system 602. Computer-controlled machine 600 includes actuator 604 and sensor 606. Actuator 604 may include one or more actuators and sensor 606 may include one or more sensors. Sensor 606 is configured to sense a condition of computer-controlled machine 600. Sensor 606 may be configured to encode the sensed condition into sensor signals 608 and to transmit sensor signals 608 to control system 602. Non-limiting examples of sensor 606 include video, radar, LiDAR, ultrasonic and motion sensors. In one embodiment, sensor 606 is an optical sensor configured to sense optical images of an environment proximate to computer-controlled machine 600.

Control system 602 is configured to receive sensor signals 608 from computer-controlled machine 600. As set forth below, control system 602 may be further configured to compute actuator control commands 610 depending on the sensor signals and to transmit actuator control commands 610 to actuator 604 of computer-controlled machine 600.

As shown in FIG. 6, control system 602 includes receiving unit 612. Receiving unit 612 may be configured to receive sensor signals 608 from sensor 606 and to transform sensor signals 608 into input signals x. In an alternative embodiment, sensor signals 608 are received directly as input signals x without receiving unit 612. Each input signal x may be a portion of each sensor signal 608. Receiving unit

612 may be configured to process each sensor signal 608 to product each input signal x. Input signal x may include data corresponding to an image recorded by sensor 606.

Control system 602 includes a classifier 614. Classifier 614 may be configured to classify input signals x into one or more labels using a machine learning (ML) algorithm, such as a neural network described above. Classifier 614 is configured to be parametrized by parameters, such as those described above (e.g., parameter θ). Parameters θ may be stored in and provided by non-volatile storage 616. Classifier 614 is configured to determine output signals y from input signals x. Each output signal y includes information that assigns one or more labels to each input signal x. Classifier 614 may transmit output signals y to conversion unit 618. Conversion unit 618 is configured to covert output signals y into actuator control commands 610. Control system 602 is configured to transmit actuator control commands 610 to actuator 604, which is configured to actuate computer-controlled machine 600 in response to actuator control commands 610. In another embodiment, actuator 604 is configured to actuate computer-controlled machine 600 based directly on output signals y.

Upon receipt of actuator control commands 610 by actuator 604, actuator 604 is configured to execute an action corresponding to the related actuator control command 610. Actuator 604 may include a control logic configured to transform actuator control commands 610 into a second actuator control command, which is utilized to control actuator 604. In one or more embodiments, actuator control commands 610 may be utilized to control a display instead of or in addition to an actuator.

In another embodiment, control system 602 includes sensor 606 instead of or in addition to computer-controlled machine 600 including sensor 606. Control system 602 may also include actuator 604 instead of or in addition to computer-controlled machine 600 including actuator As shown in FIG. 6, control system 602 also includes processor 620 and memory 622. Processor 620 may include one or more processors. Memory 622 may include one or more memory devices. The classifier 614 (e.g., machine-learning algorithms, such as those described above with regard to pre-trained classifier) of one or more embodiments may be implemented by control system 602, which includes non-volatile storage 616, processor 620 and memory 622.

Non-volatile storage 616 may include one or more persistent data storage devices such as a hard drive, optical drive, tape drive, non-volatile solid-state device, cloud storage or any other device capable of persistently storing information. Processor 620 may include one or more devices selected from high-performance computing (HPC) systems including high-performance cores, microprocessors, microcontrollers, digital signal processors, microcomputers, central processing units, field programmable gate arrays, programmable logic devices, state machines, logic circuits, analog circuits, digital circuits, or any other devices that manipulate signals (analog or digital) based on computer-executable instructions residing in memory 622. Memory 622 may include a single memory device or a number of memory devices including, but not limited to, random access memory (RAM), volatile memory, non-volatile memory, static random access memory (SRAM), dynamic random access memory (DRAM), flash memory, cache memory, or any other device capable of storing information.

Processor 620 may be configured to read into memory 622 and execute computer-executable instructions residing in non-volatile storage 616 and embodying one or more ML algorithms and/or methodologies of one or more embodiments. Non-volatile storage 616 may include one or more operating systems and applications. Non-volatile storage 616 may store compiled and/or interpreted from computer programs created using a variety of programming languages and/or technologies, including, without limitation, and either alone or in combination, Java, C, C++, C#, Objective C, Fortran, Pascal, Java Script, Python, Perl, and PL/SQL.

Upon execution by processor 620, the computer-executable instructions of non-volatile storage 616 may cause control system 602 to implement one or more of the ML algorithms and/or methodologies as disclosed herein. Non-volatile storage 616 may also include ML data (including data parameters) supporting the functions, features, and processes of the one or more embodiments described herein.

The program code embodying the algorithms and/or methodologies described herein is capable of being individually or collectively distributed as a program product in a variety of different forms. The program code may be distributed using a computer readable storage medium having computer readable program instructions thereon for causing a processor to carry out aspects of one or more embodiments. Computer readable storage media, which is inherently non-transitory, may include volatile and non-volatile, and removable and non-removable tangible media implemented in any method or technology for storage of information, such as computer-readable instructions, data structures, program modules, or other data. Computer readable storage media may further include RAM, ROM, erasable programmable read-only memory (EPROM), electrically erasable programmable read-only memory (EEPROM), flash memory or other solid state memory technology, portable compact disc read-only memory (CD-ROM), or other optical storage, magnetic cassettes, magnetic tape, magnetic disk storage or other magnetic storage devices, or any other medium that can be used to store the desired information and which can be read by a computer. Computer readable program instructions may be downloaded to a computer, another type of programmable data processing apparatus, or another device from a computer readable storage medium or to an external computer or external storage device via a network.

Computer readable program instructions stored in a computer readable medium may be used to direct a computer, other types of programmable data processing apparatus, or other devices to function in a particular manner, such that the instructions stored in the computer readable medium produce an article of manufacture including instructions that implement the functions, acts, and/or operations specified in the flowcharts or diagrams. In certain alternative embodiments, the functions, acts, and/or operations specified in the flowcharts and diagrams may be re-ordered, processed serially, and/or processed concurrently consistent with one or more embodiments. Moreover, any of the flowcharts and/or diagrams may include more or fewer nodes or blocks than those illustrated consistent with one or more embodiments.

The processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

Figure 7:
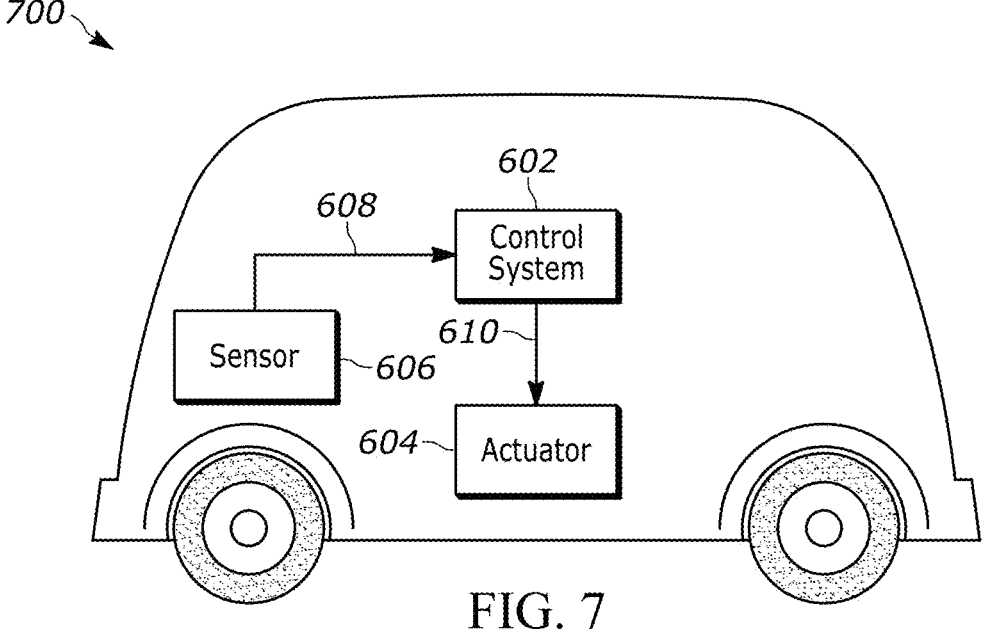
FIG. 7 depicts a schematic diagram of the control system of FIG. 6 configured to control a vehicle, which may be a partially autonomous vehicle, a fully autonomous vehicle, a partially autonomous robot, or a fully autonomous robot, according to an embodiment.

FIG. 7 depicts a schematic diagram of control system 602 configured to control vehicle 700, which may be an at least partially autonomous vehicle or an at least partially autonomous robot. Vehicle 700 includes actuator 604 and sensor 606. Sensor 606 may include one or more video sensors, cameras, radar sensors, ultrasonic sensors, LiDAR sensors, and/or position sensors (e.g. GPS). One or more of the one or more specific sensors may be integrated into vehicle 700. In the context of sign-recognition and processing as described herein, the sensor 606 is a camera mounted to or integrated into the vehicle 700. Alternatively or in addition to one or more specific sensors identified above, sensor 606 may include a software module configured to, upon execution, determine a state of actuator 604. One non-limiting example of a software module includes a weather information software module configured to determine a present or future state of the weather proximate vehicle 700 or other location.

Classifier 614 of control system 602 of vehicle 700 may be configured to detect objects in the vicinity of vehicle 700 dependent on input signals x. In such an embodiment, output signal y may include information characterizing the vicinity of objects to vehicle 700. Actuator control command 610 may be determined in accordance with this information. The actuator control command 610 may be used to avoid collisions with the detected objects.

In embodiments where vehicle 700 is an at least partially autonomous vehicle, actuator 604 may be embodied in a brake, a propulsion system, an engine, a drivetrain, or a steering of vehicle 700. Actuator control commands 610 may be determined such that actuator 604 is controlled such that vehicle 700 avoids collisions with detected objects. Detected objects may also be classified according to what classifier 614 deems them most likely to be, such as pedestrians or trees. The actuator control commands 610 may be determined depending on the classification. In a scenario where an adversarial attack may occur, the system described above may be further trained to better detect objects or identify a change in lighting conditions or an angle for a sensor or camera on vehicle 700.

In other embodiments where vehicle 700 is an at least partially autonomous robot, vehicle 700 may be a mobile robot that is configured to carry out one or more functions, such as flying, swimming, diving and stepping. The mobile robot may be an at least partially autonomous lawn mower or an at least partially autonomous cleaning robot. In such embodiments, the actuator control command 610 may be determined such that a propulsion unit, steering unit and/or brake unit of the mobile robot may be controlled such that the mobile robot may avoid collisions with identified objects.

In another embodiment, vehicle 700 is an at least partially autonomous robot in the form of a gardening robot. In such embodiment, vehicle 700 may use an optical sensor as sensor 606 to determine a state of plants in an environment proximate vehicle 700. Actuator 604 may be a nozzle configured to spray chemicals. Depending on an identified species and/or an identified state of the plants, actuator control command 610 may be determined to cause actuator 604 to spray the plants with a suitable quantity of suitable chemicals.

Vehicle 700 may be an at least partially autonomous robot in the form of a domestic appliance. Non-limiting examples of domestic appliances include a washing machine, a stove, an oven, a microwave, or a dishwasher. In such a vehicle 700, sensor 606 may be an optical sensor configured to detect a state of an object which is to undergo processing by the household appliance. For example, in the case of the domestic appliance being a washing machine, sensor 606 may detect a state of the laundry inside the washing machine. Actuator control command 610 may be determined based on the detected state of the laundry.

Figure 8:
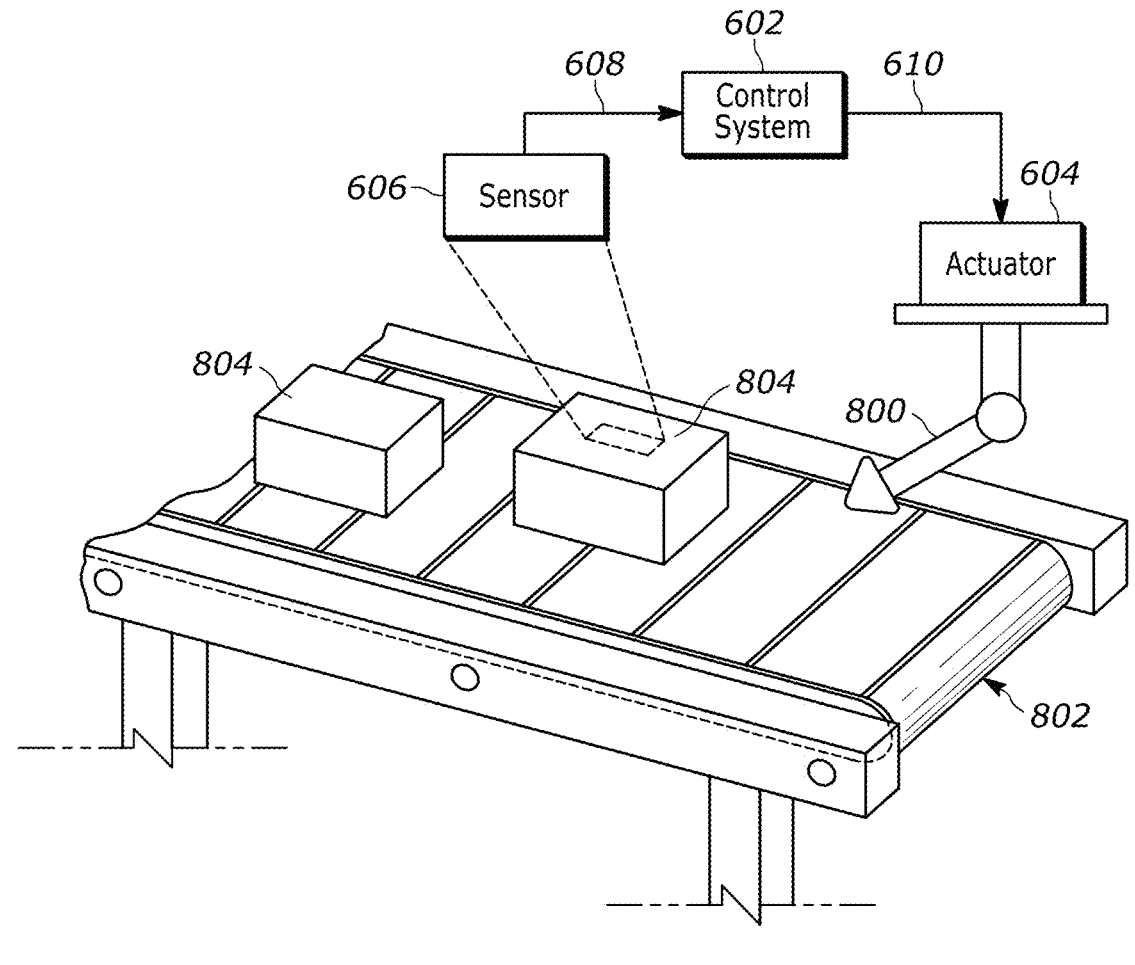
FIG. 8 depicts a schematic diagram of the control system of FIG. 6 configured to control a manufacturing machine, such as a punch cutter, a cutter or a gun drill, of a manufacturing system, such as part of a production line.

FIG. 8 depicts a schematic diagram of control system 602 configured to control system 800 (e.g., manufacturing machine), such as a punch cutter, a cutter or a gun drill, of manufacturing system 802, such as part of a production line. Control system 602 may be configured to control actuator 604, which is configured to control system 800 (e.g., manufacturing machine).

Sensor 606 of system 800 (e.g., manufacturing machine) may be an optical sensor configured to capture one or more properties of manufactured product 804. Classifier 614 may be configured to determine a state of manufactured product 804 from one or more of the captured properties. Actuator 604 may be configured to control system 800 (e.g., manufacturing machine) depending on the determined state of manufactured product 804 for a subsequent manufacturing step of manufactured product 804. The actuator 604 may be configured to control functions of system 800 (e.g., manufacturing machine) on subsequent manufactured product 802 of system 800 (e.g., manufacturing machine) depending on the determined state of manufactured product 804.

Figure 9:
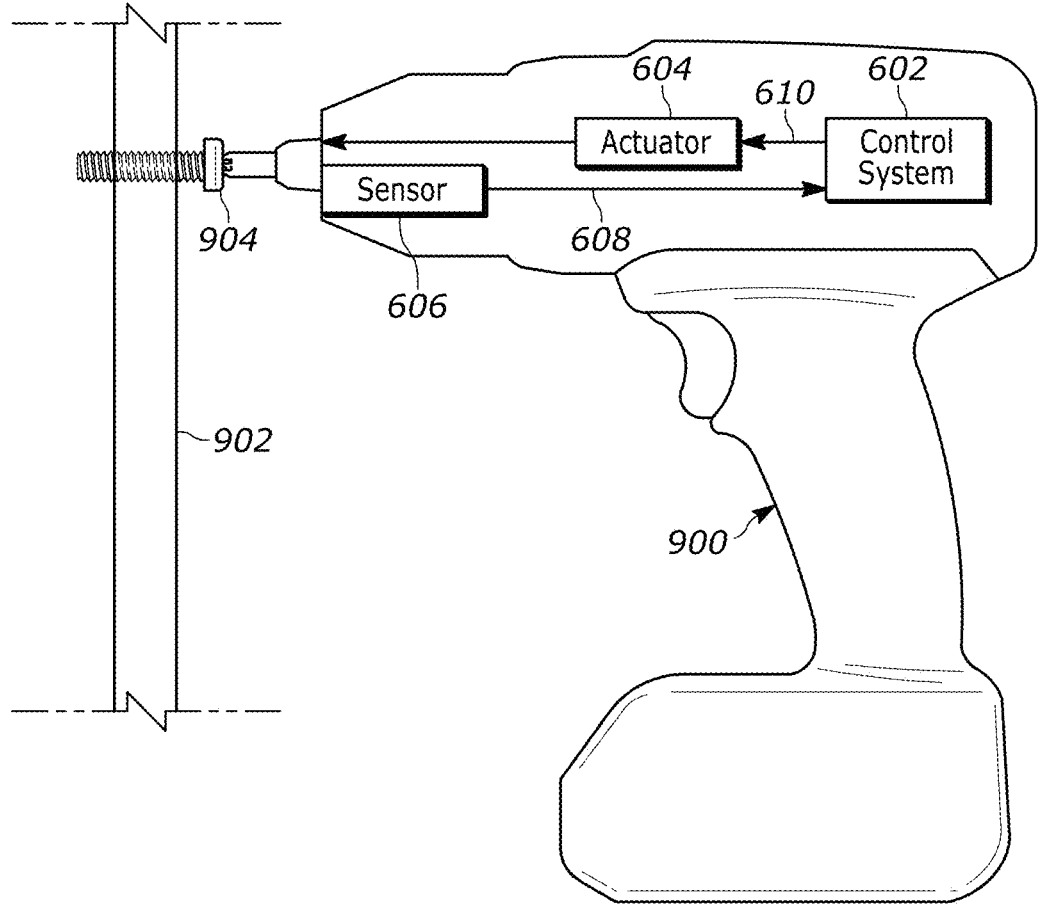
FIG. 9 depicts a schematic diagram of the control system of FIG. 6 configured to control a power tool, such as a power drill or driver, that has an at least partially autonomous mode.

FIG. 9 depicts a schematic diagram of control system 602 configured to control power tool 900, such as a power drill or driver, that has an at least partially autonomous mode. Control system 602 may be configured to control actuator 604, which is configured to control power tool 900.

Sensor 606 of power tool 900 may be an optical sensor configured to capture one or more properties of work surface 902 and/or fastener 904 being driven into work surface 902. Classifier 614 may be configured to determine a state of work surface 802 and/or fastener 904 relative to work surface 902 from one or more of the captured properties. The state may be fastener 904 being flush with work surface 902. The state may alternatively be hardness of work surface 902. Actuator 604 may be configured to control power tool 900 such that the driving function of power tool 900 is adjusted depending on the determined state of fastener 904 relative to work surface 902 or one or more captured properties of work surface 902. For example, actuator 604 may discontinue the driving function if the state of fastener 904 is flush relative to work surface 902. As another non-limiting example, actuator 604 may apply additional or less torque depending on the hardness of work surface 902.

Figure 10:
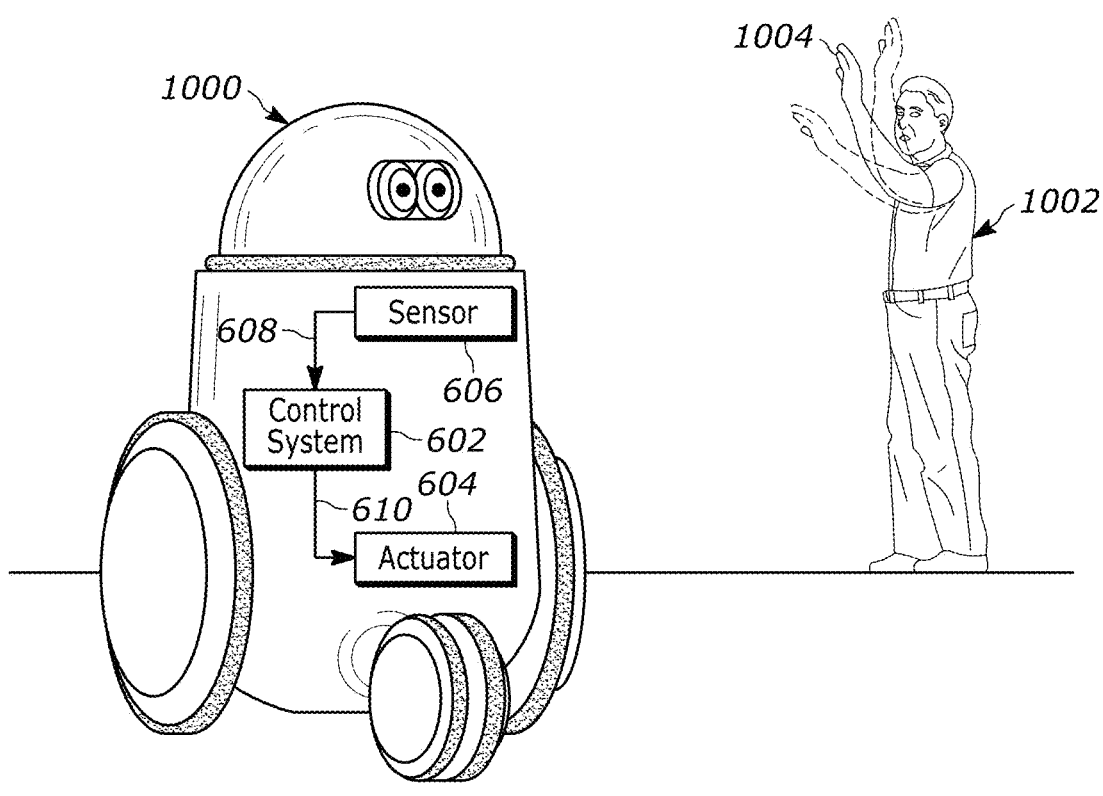
FIG. 10 depicts a schematic diagram of the control system of FIG. 6 configured to control an automated personal assistant.

FIG. 10 depicts a schematic diagram of control system 602 configured to control automated personal assistant 1000. Control system 602 may be configured to control actuator 604, which is configured to control automated personal assistant 1000. Automated personal assistant 1000 may be configured to control a domestic appliance, such as a washing machine, a stove, an oven, a microwave or a dishwasher.

Sensor 606 may be an optical sensor and/or an audio sensor. The optical sensor may be configured to receive video images of gestures 1004 of user 1002. The audio sensor may be configured to receive a voice command of user 1002.

Control system 602 of automated personal assistant 1000 may be configured to determine actuator control commands 610 configured to control system 602. Control system 602 may be configured to determine actuator control commands 610 in accordance with sensor signals 608 of sensor 606. Automated personal assistant 1000 is configured to transmit sensor signals 6508 to control system 602. Classifier 614 of control system 602 may be configured to execute a gesture recognition algorithm to identify gesture 1004 made by user 1002, to determine actuator control commands 610, and to transmit the actuator control commands 610 to actuator 604. Classifier 614 may be configured to retrieve information from non-volatile storage in response to gesture 1004 and to output the retrieved information in a form suitable for reception by user 1002.

Figure 11:
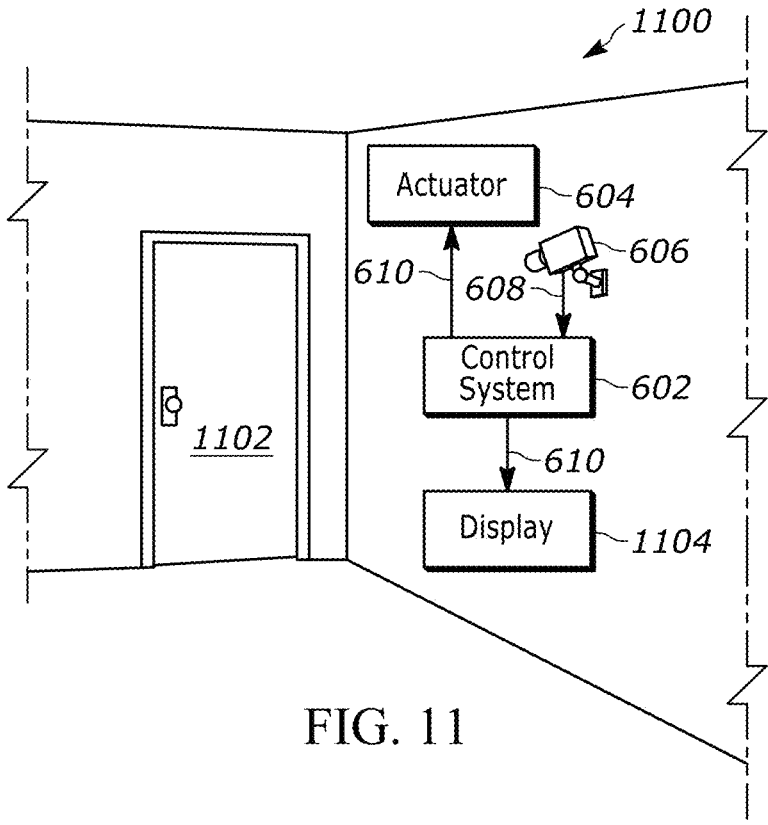
FIG. 11 depicts a schematic diagram of the control system of FIG. 6 configured to control a monitoring system, such as a control access system or a surveillance system.

FIG. 11 depicts a schematic diagram of control system 602 configured to control monitoring system 1100. Monitoring system 1100 may be configured to physically control access through door 1102. Sensor 606 may be configured to detect a scene that is relevant in deciding whether access is granted. Sensor 606 may be an optical sensor configured to generate and transmit image and/or video data. Such data may be used by control system 602 to detect a person's face.

Classifier 614 of control system 602 of monitoring system 1100 may be configured to interpret the image and/or video data by matching identities of known people stored in non-volatile storage 616, thereby determining an identity of a person. Classifier 614 may be configured to generate and an actuator control command 610 in response to the interpretation of the image and/or video data. Control system 602 is configured to transmit the actuator control command 610 to actuator 604. In this embodiment, actuator 604 may be configured to lock or unlock door 1102 in response to the actuator control command 610. In other embodiments, a non-physical, logical access control is also possible.

Monitoring system 1100 may also be a surveillance system. In such an embodiment, sensor 606 may be an optical sensor configured to detect a scene that is under surveillance and control system 602 is configured to control display 1104. Classifier 614 is configured to determine a classification of a scene, e.g. whether the scene detected by sensor 606 is suspicious. Control system 602 is configured to transmit an actuator control command 610 to display 1104 in response to the classification. Display 1104 may be configured to adjust the displayed content in response to the actuator control command 610. For instance, display 1104 may highlight an object that is deemed suspicious by classifier 614. Utilizing an embodiment of the system disclosed, the surveillance system may predict objects at certain times in the future showing up.

Figure 12:
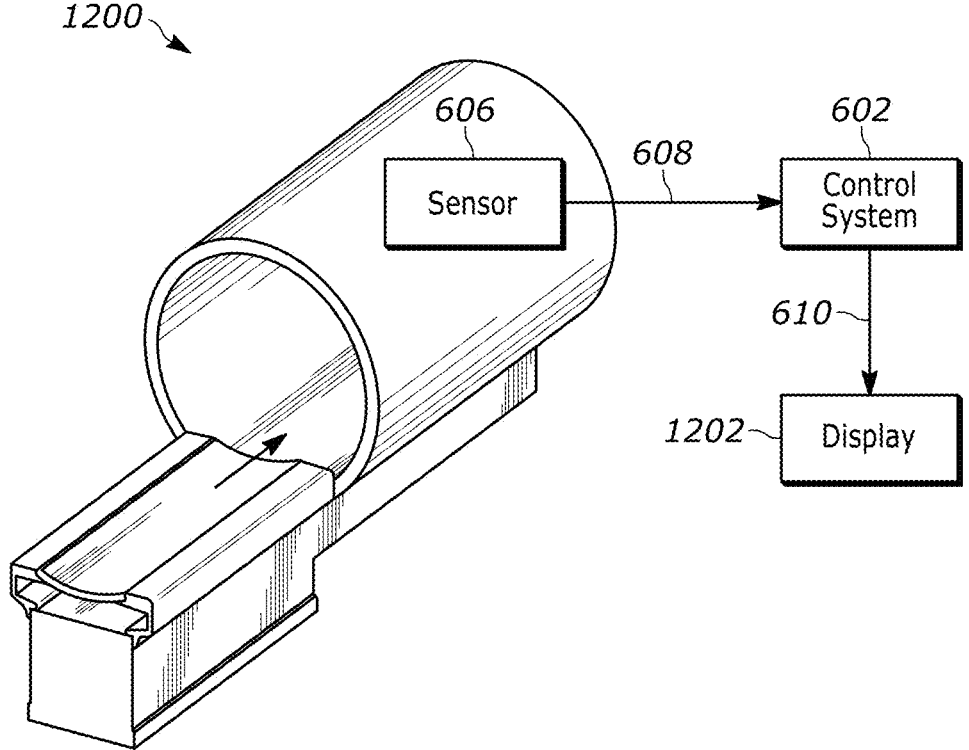
FIG. 12 depicts a schematic diagram of the control system of FIG. 6 configured to control an imaging system, for example an MM apparatus, x-ray imaging apparatus or ultrasonic apparatus.

FIG. 12 depicts a schematic diagram of control system 602 configured to control imaging system 1200, for example an Mill apparatus, x-ray imaging apparatus or ultrasonic apparatus. Sensor 606 may, for example, be an imaging sensor. Classifier 614 may be configured to determine a classification of all or part of the sensed image. Classifier 614 may be configured to determine or select an actuator control command 610 in response to the classification obtained by the trained neural network. For example, classifier 614 may interpret a region of a sensed image to be potentially anomalous. In this case, actuator control command 610 may be determined or selected to cause display 1202 to display the imaging and highlighting the potentially anomalous region.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, to the extent any embodiments are described as less desirable than other embodiments or prior art implementations with respect to one or more characteristics, these embodiments are not outside the scope of the disclosure and can be desirable for particular applications.

What is claimed is:

1. A computer-implemented method for determining a 6D pose of an object in an image, the computer-implemented method comprising:

receiving an input image from a sensor, wherein the input image includes an object;

via a trained image encoder, transforming the input image into a normal map and an instance segmentation map, wherein the image encoder is configured to generate both the normal map and the instance segmentation map from the same input image;

encoding the normal map with per-pixel 2D features;

supplying both the normal map and the instance segmentation map, as generated by the image encoder, as joint inputs to a deep neural network;

executing the deep neural network to select a three-dimensional CAD model from memory that resembles the object in the image;

encoding the three-dimensional CAD model with per-pixel 3D features by:

estimating by the deep neural network based on the normal map and the instance segmentation man, a scale variable (S) indicative of a density of per-pixel 2D features of the object in the input image, and providing the scale variable (S) as an input to a three-dimensional graphical neural network (GNN 3D) that encodes the three-dimensional CAD model with per-pixel 3D features, the GNN 3D being configured to adapt a granularity of feature aggregation in the three-dimensional CAD model based on the scale variable (S);

matching the per-pixel 2D features with the per-pixel 3D features to obtain correspondences between the per-pixel 2D features and the per-pixel 3D features; and determining a 6D pose of the object based on the correspondences.

2. The computer-implemented method of claim 1, wherein the encoding of the normal map is performed utilizing a two-dimensional graphical neural network (GNN 2D).

3. The computer-implemented method of claim 1, wherein the selecting the three-dimensional CAD model from memory is performed using a deep neural network (DNN).

4. The computer-implemented method of claim 3, wherein the DNN includes both a classification function and a scale estimation function.

5. The computer-implemented method of claim 3, wherein the normal map and the instance segmentation map are inputs to the DNN such that the DNN selects the three-dimensional CAD model from memory based on the inputs.

6. The computer-implemented method of claim 1, wherein the encoding the three-dimensional CAD model with the per-pixel 3D features includes placing weights on the per-pixel 3D features based on an observed distance of the object from the sensor.

7. The computer-implemented method of claim 1, wherein the sensor is a camera, a radar sensor, a lidar sensor, or a sonar sensor.

8. A system for determining a 6D pose of an object in an image utilizing image processing, the system comprising:

an input interface configured to receive an input image from a sensor;

a processor in communication with the input interface and programmed to:

utilize an image encoder to convert the input into a normal map and an instance segmentation map, encode the normal map with per-pixel 2D features, select a three-dimensional CAD model from memory associated with an object in the input image, encode the three-dimensional CAD model with per-pixel 3D features by:

estimating, by the deep neural network based on the normal map and the instance e segmentation map, a scale variable (S) indicative of a density of per-pixel 2D features of the object in the input image, and providing the scale variable (S) as an input to a three-dimensional graphical neural network (GNN 3D) that encodes the three-dimensional CAD model with per-pixel 3D features, the GNN 3D being configured to adapt a granularity of feature aggregation in the three-dimensional CAD model based on the scale variable (S), match the per-pixel 3D features with the per-pixel 3D features to obtain correspondences therebetween, and determine a 6D pose of the object based on the correspondences.

9. The system of claim 8, wherein the processor is further programmed to encode the normal map utilizing a two-dimensional graphical neural network (GNN 2D).

10. The system of claim 8, wherein the processor is further programmed to select the three-dimensional CAD model from memory using a deep neural network (DNN).

11. The system of claim 10, wherein the normal map and the instance segmentation map are inputs to the DNN such that the processor is programmed to select, via the DNN, the three-dimensional CAD model from memory based on the normal map and the instance segmentation map.

12. The system of claim 8, wherein the processor is further programmed to place weights on the per-pixel 3D features when encoding the three-dimensional CAD model with the per-pixel 3D features, wherein the weights are based on an observed distance of the object from the sensor.

13. A computer-implemented method for determining a 6D pose of an object in an image, the computer-implemented method comprising:

receiving an input image from a sensor, wherein the input image includes an object in the image;

via a trained image encoder, producing a normal map corresponding to the image;

via the trained image encoder, producing an instance segmentation map corresponding to the image, wherein the image encoder is configured to generate both the normal map and the instance segmentation map from the same input image;

determining local per-pixel features of the object in the normal map;

selecting a three-dimensional CAD model from memory that resembles the object in the image;

estimating by a deep neural network based on the normal map and the instance segmentation map, a scale variable (S) indicative of a density of local per-pixel features of the object in the input image;

determining local per-pixel features of the three-dimensional CAD model by providing the scale variable (S) as an input to a three-dimensional graphical neural network (GNN 3D) that encodes the three-dimensional CAD model with per-pixel 3D features, the GNN 3D being configured to adapt a granularity of feature aggregation in the three-dimensional CAD model based on the scale variable (S);

matching the local per-pixel features of the object in the normal map with the local per-pixel features of the three-dimensional CAD model to find correspondences; and sending control signals to control a robot based on the correspondences.

14. The computer-implemented method of claim 13, wherein the step of matching includes placing weights on the local per-pixel features in the normal map or the local per-pixel features in the three-dimensional CAD model based on a density of those local per-pixel features.

15. The computer-implemented method of claim 13, wherein:

the step of determining the local per-pixel features of the object in the normal map is performed utilizing a first machine-learning model;

the step of selecting the three-dimension CAD from memory is performed utilizing a second machine-learning model; and the step of determining local per-pixel features of the three-dimensional CAD model is performed utilizing a third machine-learning model.

16. The computer-implemented method of claim 15, wherein:

the third machine-learning model determines at least some of the local per-pixel features of the three-dimensional CAD model based on a density of the local per-pixel features of the object in the normal map.

17. The computer-implemented method of claim 1, wherein the GNN 3D is configured to adapt the granularity of feature aggregation in the three-dimensional CAD model based on the scale variable (S) such that, for denser per-pixel 2D features, higher weights are assigned to closer neighboring nodes in the 3D graph, and for sparser per-pixel 2D features, higher weights are assigned to further neighboring nodes.

18. The system of claim 8, wherein the GNN 3D is configured to adapt the granularity of feature aggregation in the three-dimensional CAD model based on the scale variable (S) such that, for denser per-pixel 2D features, higher weights are assigned to closer neighboring nodes in the 3D graph, and for sparser per-pixel 2D features, higher weights are assigned to further neighboring nodes.

* * * * *